(12) United States Patent
Lange et al.

(10) Patent No.: US 9,559,664 B2
(45) Date of Patent: Jan. 31, 2017

(54) ELECTRICAL APPARATUS WITH A FILTER FOR SUPPRESSING INTERFERENCE SIGNALS

(71) Applicants: Heinz Lange, Dreieich (DE); Bernd Trageser, Hainburg (DE)

(72) Inventors: Heinz Lange, Dreieich (DE); Bernd Trageser, Hainburg (DE)

(73) Assignee: Continental Automotive GmbH, Hannover (DE)

( * ) Notice: Subject to any disclaimer, the term of this patent is extended or adjusted under 35 U.S.C. 154(b) by 400 days.

(21) Appl. No.: 14/367,752

(22) PCT Filed: Dec. 4, 2012

(86) PCT No.: PCT/EP2012/074332
§ 371 (c)(1),
(2) Date: Jun. 20, 2014

(87) PCT Pub. No.: WO2013/092199
PCT Pub. Date: Jun. 27, 2013

(65) Prior Publication Data
US 2015/0123469 A1    May 7, 2015

(30) Foreign Application Priority Data
Dec. 22, 2011 (DE) .......................... 10 2011 089 574

(51) Int. Cl.
*B60L 1/00* (2006.01)
*H03H 17/02* (2006.01)
(Continued)

(52) U.S. Cl.
CPC ............... *H03H 17/02* (2013.01); *B60L 1/00* (2013.01); *G09G 5/00* (2013.01); *H01F 27/34* (2013.01);
(Continued)

(58) Field of Classification Search
CPC ...................................................... H03H 17/02
(Continued)

(56) References Cited

U.S. PATENT DOCUMENTS 4,802,055 A * 1/1989 Beckerman ............ H02H 9/005
361/111
5,422,620 A   6/1995 Bitterli
(Continued)

FOREIGN PATENT DOCUMENTS

| CN | 101123138 | 2/2008 |
|----|-----------|--------|
| CN | 101127291 | 2/2008 |
| CN | 101960716 | 1/2011 |

OTHER PUBLICATIONS

Dipl. In. Uwe Lorenzen: Elekromagnetische Verträglicheit and NKL GmbH, Jan. 26, 2009 (Jan. 26, 2009), XP002695734.
(Continued)

*Primary Examiner* — Stephen W Jackson
(74) *Attorney, Agent, or Firm* — Cozen O'Connor

(57) ABSTRACT

An electrical apparatus for a vehicle has a primary control unit for controlling and supplying the electrical apparatus with energy and a secondary output unit subordinate to the control unit and outputs data transmitted by the control unit. The control unit and the output unit are connected to one another via a data line. The control unit has an electrical filter with three inductor coils for suppressing interference signals. The inductor coils are inductively coupled to one another such that a direction of a magnetic flux produced by a first flow of current in the first inductor coil and of a magnetic flux produced by a second flow of current in the second inductor coil in the main body is opposite a direction of a further magnetic flux produced by a third flow of current in the third inductor coil in the main body.

11 Claims, 3 Drawing Sheets

(51) Int. Cl.
*G09G 5/00* (2006.01)
*H01F 27/34* (2006.01)

(52) U.S. Cl.
CPC .......... *G09G 5/006* (2013.01); *G09G 2330/02* (2013.01); *G09G 2330/06* (2013.01); *G09G 2380/10* (2013.01)

(58) Field of Classification Search
USPC .......................................................... 307/9.1
See application file for complete search history.

(56) References Cited

U.S. PATENT DOCUMENTS

| | | | | |
|---|---|---|---|---|
| 7,135,952 B2* | 11/2006 | Harding | ............ | H01F 17/0006 336/175 |
| 7,199,692 B2* | 4/2007 | Suzuki | ............ | H03H 7/427 336/170 |
| 7,277,002 B2* | 10/2007 | Harding | ............ | H01F 17/0006 29/602.1 |
| 2006/0049890 A1 | 3/2006 | Wasaki et al. | | |
| 2007/0288102 A1 | 12/2007 | Korzin | | |

OTHER PUBLICATIONS

Murata.com: "26to 30.pdf", Murata.com, Dec. 15, 2011 (Dec. 15, 2011), XP002695735.

\* cited by examiner

ELECTRICAL APPARATUS WITH A FILTER FOR SUPPRESSING INTERFERENCE SIGNALS

CROSS-REFERENCE TO RELATED APPLICATIONS

This is a U.S. national stage of application No. PCT/EP2012/074332, filed on 4 Dec. 2012, which claims priority to the German Application No. 10 2011 089 574.4, filed 22 Dec. 2011, the content of both incorporated herein by reference.

BACKGROUND OF THE INVENTION

1. Field of the Invention

The present invention relates to an electrical apparatus with a filter for suppressing interference signals and to the use of the electrical apparatus in a vehicle.

2. Related Art

Owing to the continually increasing performance of modern electronics, in particular in the automotive industry, and, in this connection, an increasing degree of integration with regard to new additional functions, new challenges present themselves. These relate, for example, to a central voltage supply and central generation of graphics, image and control data with powerful arithmetic and logic units and to providing the data to display units via high-performance data interfaces while, at the same time, adhering to existing electromagnetic compatibility values (EMC values).

Up to now, display units have been configured as independent devices with local arithmetic and logic units, to which only the supply voltage was supplied from the external control device. The image data is independently computed and displayed in the smart display unit on the basis of control data fed via CAN or MOST. If the display units are configured without a local arithmetic and logic unit, the image data is provided by the arithmetic and logic unit; however, no supply voltage for the display unit is provided by the arithmetic and logic unit. Substantial EMC problems owing to loop formation or the like are associated with such a concept, however.

SUMMARY OF THE INVENTION

Therefore, an object of the present invention is to propose an electrical apparatus that avoids the stated disadvantages, that is to say by which it is possible to provide a supply voltage in an interference-free manner by an arithmetic and logic unit.

This object is achieved according to an aspect of the invention by an electrical apparatus and the use of the electrical apparatus in a vehicle.

The electrical apparatus, which is in particular for a vehicle, comprises a primary control unit for controlling and for supplying energy to the electrical apparatus and, downstream of the control unit, a secondary output unit for outputting data transmitted by the control unit. The primary control unit and the secondary output unit are connected to one another via a data line. The control unit comprises an electrical filter for suppressing interference signals, having three inductors arranged on a ferromagnetic base body and electrically isolated from one another. The three inductors are inductively coupled to one another such that a direction of a magnetic flux generated in the base body by a first current flow in the first inductor and by a second current flow in the second inductor is opposite a direction of a further magnetic flux generated in the base body by a third current flow in the third inductor. In this connection, the first inductor supplies a first external supply voltage to the control unit, the second inductor supplies a second external supply voltage to the output unit via a supply voltage line running between the control unit and the output unit and the third inductor is at a common reference potential for the first supply voltage and the second supply voltage. The third inductor is connected, as a common return line of the first current flow and the second current flow, to a ground line running between the output unit and the control unit.

Owing to the electrical apparatus, the control unit can be supplied the first supply voltage and the output unit can be supplied the second supply voltage, without EMC problems arising. Interference signals are supplied to the devices via the electrical filter, which is configured to conduct both supply voltages in an interference-free manner. By designing the third inductor as common return conductor, forced balancing of input currents and return currents for the entire electrical apparatus, that is to say both the arithmetic and logic unit and the output unit, occurs. In this case, it is particularly advantageous that EMC filtering in the sense of a common mode filter take places through a respective component itself and minimal loop formation between data line and supply line occurs. In addition, a reference potential, which has already been filtered, can be used. As a result of this, in particular, a high degree of interference resistance with respect to external interference is achieved.

In an advantageous development, the data line is a shielded line, wherein the shielding is part of the ground line. A separate ground line or return line between the arithmetic and logic unit and the output unit can therefore be omitted and the connection can be configured in a more compact manner. In particular, as a result of this, the weight of the electrical apparatus can be reduced and production costs can be reduced and a lower number of pins is required.

The output unit typically comprises a display unit, preferably a head-up display, by which a user of the electrical apparatus is presented with visually perceivable information. Alternatively or in addition, the display unit can also be designed to output audio signals.

It can also be provided that the control unit and/or the output unit has a switched-mode power supply for supplying one of the supply voltages. As a result of this, the respective supply voltage can be transformed into a voltage and/or current intensity suitable for the respective device.

Advantageously, the control unit has a graphics control unit, which is preferably supplied via the switched-mode power supply of the control unit and which transmits graphics data to the display unit via the data line. Thus, the graphics data can be processed and passed on once again by the graphics control unit separately and independently of further units contained in the arithmetic and logic unit.

The base body is usually a toroidal core with an open or closed magnetic path. As a result of this, the magnetic fluxes are conducted in a closed arrangement and stray fields are avoided. Alternatively, the base body can also be rod-shaped. The base body is particularly advantageously made of a ferrite.

In an advantageous development, at least one of the inductors is wound in a bifilar manner with, that is to say parallel to another of the inductors. Particularly advantageously, the third inductor is wound in a bifilar manner with the first inductor or the second inductor. Owing to the bifilar winding on the base body, the latter can be embodied in a more compact and thus space-saving manner.

The base body can also have three limbs connected to one another by two yokes. Particularly advantageously, each of the three inductors can sit on one of the limbs, with the result that a short circuit owing to contact between two of the inductors is reliably avoided.

The reference potential of the first supply voltage and the second supply voltage is advantageously isolated from an external reference potential. Thus, a dedicated reference potential is defined for the electrical apparatus, and arithmetic and logic unit and display unit can be referenced to the same reference potential.

As described above, the electrical apparatus is usually used in a vehicle, preferably in a motor vehicle. In a particularly advantageous manner, the reference potential of the electrical apparatus is undefined or "floating" with respect to a ground potential of the vehicle.

BRIEF DESCRIPTION OF THE DRAWINGS

Exemplary embodiments of the invention are illustrated in the drawings and are explained below on the basis of FIGS. 1 to 5, in which.

DETAILED DESCRIPTION OF THE PRESENTLY PREFERRED EMBODIMENTS

Figure 1:
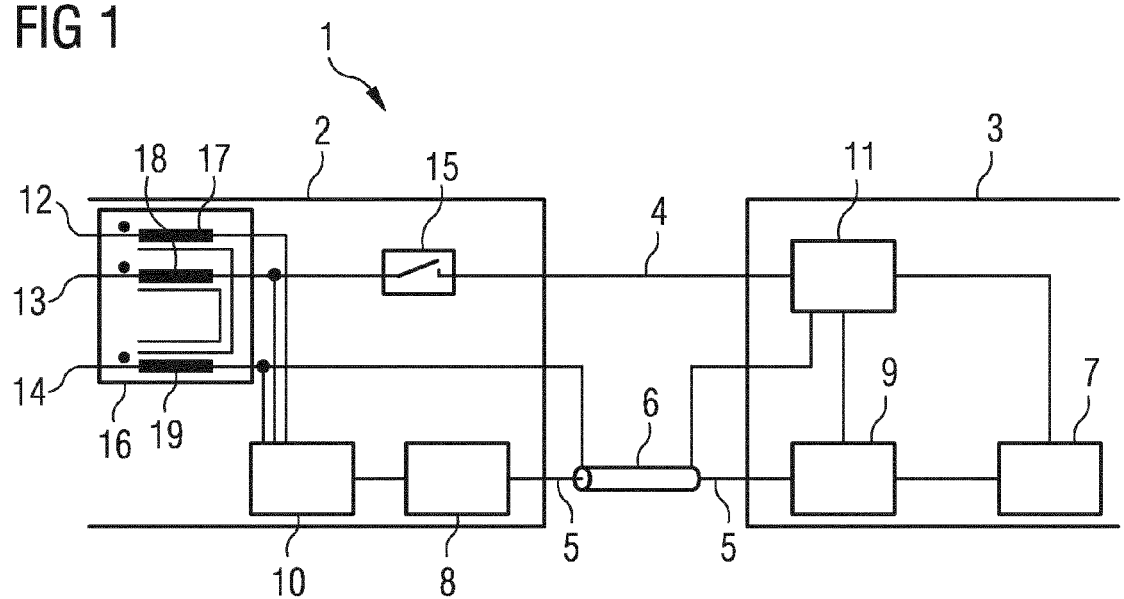
FIG. 1 shows a circuit of an electrical apparatus that comprises an arithmetic and logic unit as a control unit and a head-up display as display unit.

FIG. 1 illustrates a circuit of an electrical apparatus 1. The electrical apparatus 1 is used in a motor vehicle, is therefore installed in the motor vehicle and comprises an arithmetic and logic unit 2 as primary control unit and a display unit 3 as secondary output unit. The display unit 3 is connected downstream of the arithmetic and logic unit 2 and is supplied energy via a supply voltage line 4 by the arithmetic and logic unit. A data line 5 runs between the arithmetic and logic unit 2 and the display unit 3 and is used to transmit data. The data line 5 comprises a total of four conductors carrying data. For the purposes of shielding, the data line 5 has tubular shielding 6, which is also used as a ground return line.

The arithmetic and logic unit 2 is part of a cluster of the motor vehicle. The display unit 3 is a head-up display that projects various information directly onto a windshield as display 7 of the vehicle in the field of vision of a vehicle occupant. Of course, the display 7 can also be integrated in a dashboard as a conventional display, for example as an LCD display. The image data to be displayed are calculated by a graphics controller 8 in the arithmetic and logic unit 2 and are transmitted via the data line 5 to a timing controller 9 integrated in the display unit 3 which displays the data on the display 7 at predefined times. The arithmetic and logic unit 2 is supplied voltage via a first switched-mode power supply 10 integrated in the arithmetic and logic unit 2 and which also supplies the graphics controller 8. A second switched-mode power supply 11 is likewise integrated in the display unit 3, is used for the voltage supply to the display unit 3 and, for this purpose, is connected via lines to the timing controller 9 and to the display 7. The shielding 6 of the data line 5 is used as supply voltage return conductor of the display unit 3.

The arithmetic and logic unit 2 is supplied energy via two terminals 12, 13 externally, for example by an onboard power supply system of the vehicle. A terminal 14 is used as reference potential and as return line for currents conducted via the terminals 12 and 13. The reference potential is a common reference potential for the arithmetic and logic unit 2 and the display unit 3. For this purpose, the terminal 12 can be used as "terminal 30", that is to say as the terminal at which a permanent supply voltage is present, while the terminal 13 is used as "terminal 30B", that is to say as the terminal at which a switched supply voltage for loads is present. Likewise, the terminal 14 can be used as "terminal 31", that is to say as ground. The two supply voltages conducted via the terminals 12, 13 are of different magnitudes, are conducted in a manner coupled to the first switched-mode power supply 10 and are monitored separately. In the arithmetic and logic unit 2, the supply voltage for the display unit 3 is diverted and conducted via, for example, a SMART-FET high-side switch 15 to the display unit 3. The switch 15 interrupts a current consumption by the display unit 3 in the rest mode, that is to say when the motor vehicle is not in operation and therefore no display of image data is necessary.

The electrical apparatus 1 thus has two circuits. A first circuit runs starting from the terminal 12 within the arithmetic and logic unit 2 via the first switched-mode power supply 10 to the terminal 14. A second circuit runs starting from the terminal 12 via the switch 15 to the display unit 3 and via the shielding 6 as return conductor to the terminal 14. The shielding 6 shields the conductors of the data line 5 which carry the data but is also used as ground conductor for the supply voltage line 4 and prevents EMC problems by a minimized loop formation.

The arithmetic and logic unit 2 has an electrical filter 16 connected to the terminals 12, 13, 14. The electrical filter 16 consists of a ferrite toroidal core as base body, on which three inductors 17, 18, 19 are arranged. The inductors 17, 18, 19 are electrically isolated from one another but inductively coupled to one another via the toroidal core. The first inductor 17 is connected to the terminal 12 and is used to pass on the first supply voltage and a first current flow to the first switched-mode power supply 10. The second inductor 18 is connected to the terminal 13 and conducts a second supply voltage and a second current flow via the switch 15 to the display unit 3. The third inductor 19 is connected to the terminal 14 and forms a common reference potential for the first supply voltage and the second supply voltage and is used as common return line for the first current flow and the second current flow. For this purpose, the third inductor 19 is also connected to the shielding 6. The shielding 6 therefore forms a filtered ground connection.

Owing to the inductive coupling of the three inductors 17, 18, 19, a direction of a magnetic flux caused by the first current flow in the first inductor 17 and by the second current flow in the second inductor 18 is opposite a direction of a magnetic flux generated by a third current flow in the third coil. In this connection, a current intensity of the third current flow corresponds to a sum of a current intensity of the first current flow and a current intensity of the second current flow. As a result, the magnetic fluxes cancel out exactly.

If, as in the electrical apparatus 1 in FIG. 1, the arithmetic and logic unit 2 has filter elements in a ground line for reasons of EMC, a voltage supply to the display unit 3 and a reference potential of the data line 5 as image data interface are referenced to the same reference potential. A separate ground connection of the display unit 3 to almost any point on the vehicle is therefore not possible. Balancing of forward and return currents of the voltage supply is ensured by the electrical filter 16 as supply voltage filter.

The reference potential of the electrical apparatus 1 is completely floating with respect to a ground connection of the motor vehicle. In this connection, the term "floating" is intended to mean that no connection is present between the terminal 14, which is at the reference potential, and the ground connection of the motor vehicle. That is to say, there is an isolation between a ground connection of the electrical apparatus 1 and the ground connection of the motor vehicle. Thus, it is not possible to define the reference potential of the electrical apparatus 1 with respect to the ground connection as reference potential of the motor vehicle. That is to say, the reference potentials are undefined with respect to one another.

Figure 2:
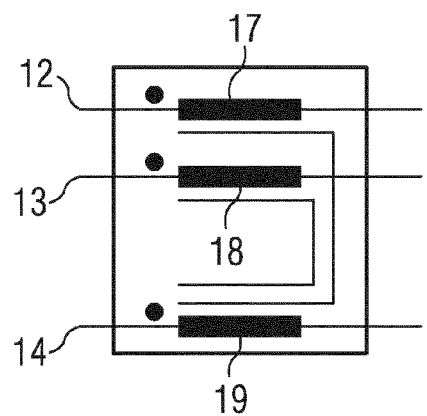
FIG. 2 shows a circuit diagram of an electrical filter.

FIG. 2 illustrates the electrical filter 16, which has already been illustrated in FIG. 1 as part of the arithmetic and logic unit 2, as a separate component. Recurring features are provided with identical reference signs in this figure as well as in the following figures. The electrical filter 16, which is also referred to as triple common mode filter, has two inputs for two supply voltages via the terminals 12 and 13 and two outputs which correspond to the inputs and are connected to further components of the arithmetic and logic unit 2. The terminal 14 as input and a corresponding output are provided for the common reference potential, the output being connected to a ground line of the arithmetic and logic unit 2 and the display unit 3. The electrical filter 16 can be installed vertically or horizontally as SMD component on printed circuit boards and can process currents of up to 5 A, and preferably 2.5 A flow via the terminal 12 or the terminal 13. An impedance of the electrical filter 16 is 500 Ω at a frequency of 100 MHz. A DC resistance of an individual one of the inductors 17, 18, 19 is less than or equal to 12 mΩ. The electrical filter 16 is usable in a temperature range of from −40° C. up to 105° C.

By the arrangement shown in FIG. 2, the electrical filter 16 is active at its full inductance for unbalanced common mode interference signals, while only a substantially lower leakage inductance is active for balanced (normal mode) useful signals or the current flows of an operating current. In this connection, common mode signals are intended to be characterized in that they are present in the same phase at all inputs of a module of the arithmetic and logic unit 2 or the display unit 3.

Figure 3:
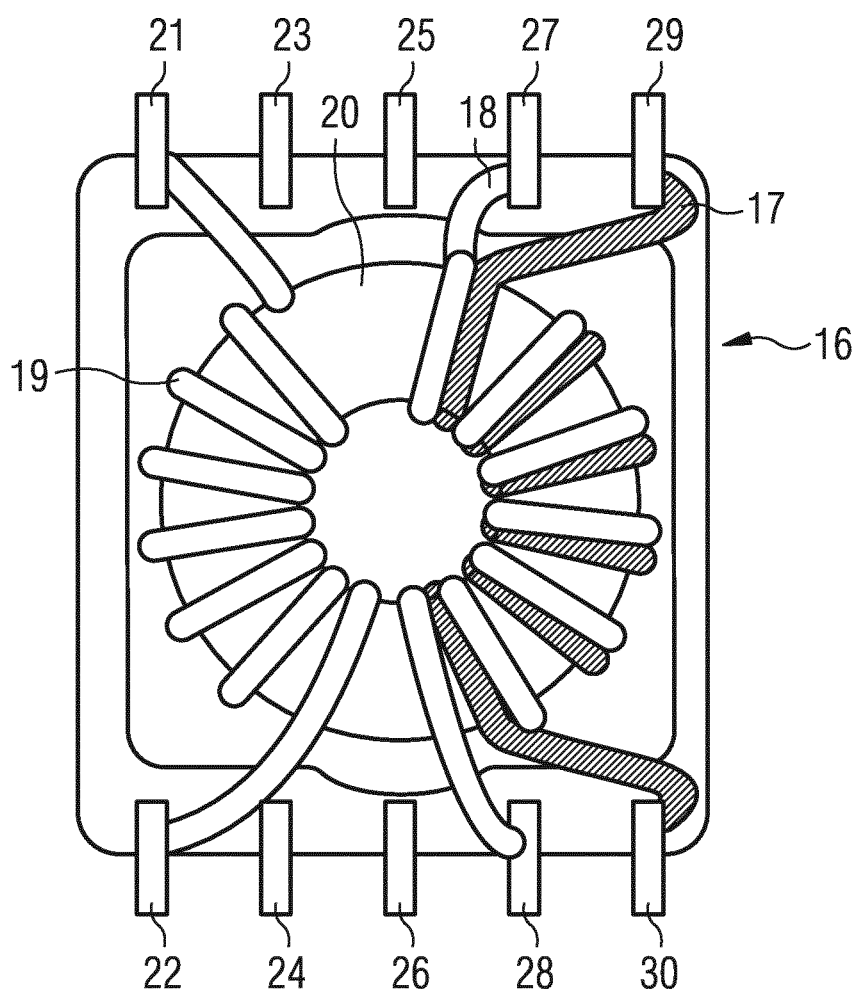
FIG. 3 shows an exemplary embodiment of the electrical filter.

A first embodiment of the electrical filter 16 is illustrated in FIG. 3. The inductors 17, 18, 19 are arranged on the closed toroidal core 20 with in each case the same winding direction and the same number of turns. In an alternative embodiment, the toroidal core 20 is not closed but open, that is to say has at least one air gap, or, instead of a toroidal core 20, a rod-shaped base body can be used. The third inductor 19 has seven turns and is wound around a left half of the toroidal core 20. The third inductor 19 is connectable to the terminal 14 via a connection 21; a connection 22 is in contact with the ground line of the arithmetic and logic unit 2 and the display unit 3. The electrical filter 16 has further connections 23, 24, 25, 26, which are not used in the exemplary embodiment illustrated in FIG. 3, however. However, in other embodiments, additional coils can be connected to the connections 23, 24, 25, 26. The second inductor 18 and the first inductor 17 are arranged on a right half of the toroidal core 20 and are wound in a bifilar manner. Owing to the bifilar winding, the second inductor 18 and the first inductor 17 therefore run parallel to one another on the toroidal core 20. The second inductor 18 is connected to connections 27 and 28. The connection 27 leads to the terminal 13, and the connection 28 leads to an electrical line, which is connected to the first switched-mode power supply 10 and the switch 15, as shown in FIG. 1. Likewise, the first inductor 17 is connected to connections 29 and 30. The connection 29 leads to the terminal 12, while the connection 30 is used to connect an electrical line leading to the first switched-mode power supply 10.

Figure 4:
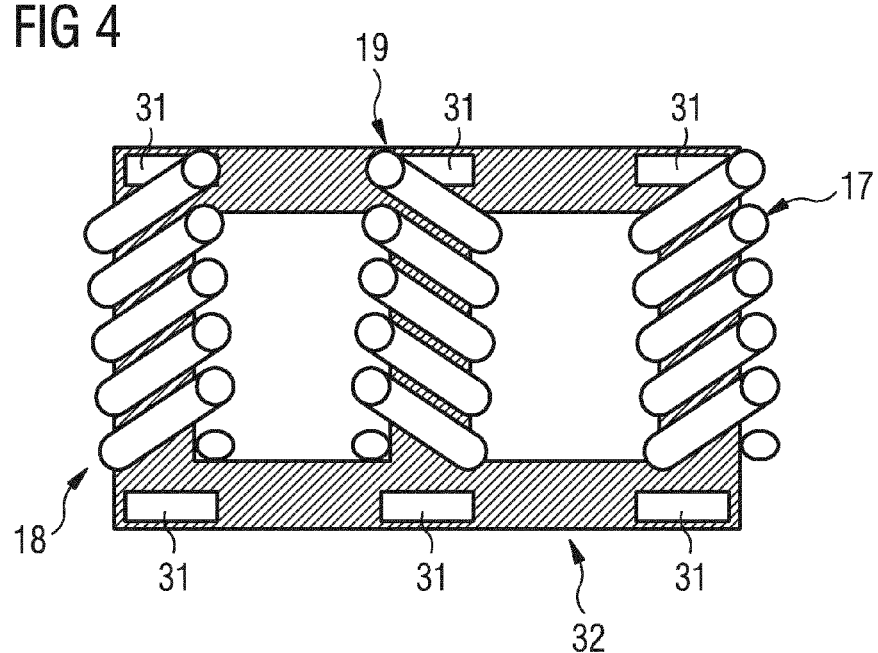
FIG. 4 shows another exemplary embodiment of the electrical filter.

FIG. 4 shows another embodiment of the electrical filter 16. A base body 32 made from a ferrite has three limbs positioned vertically and connected to one another by yokes that run horizontally at ends of the limbs. One of the three inductors 17, 18, 19 sits on each of the limbs. The second inductor 18 is fitted on a left limb, the third inductor 19 is fitted on a central limb and the first inductor 17 is fitted on a right limb. The inductors 17, 18, 19 have an identical number of five turns. The winding direction of the first inductor 17 and the second inductor 18 is the same; however, the third inductor 19 has a winding direction opposite that of the first inductor 17 and second inductor 18. The base body 32 has a metal plating 31 applied by soldering at multiple points which are located below and above the limbs, which metal plating connects the ferrite laminations of the base body 32 to one another.

The magnetic fluxes caused in the arrangement illustrated in FIG. 4 by the first inductor 17 and the second inductor 18 necessarily flow to the central limb, where a magnetic flux caused by the third inductor 19 is oriented in the opposite direction to the first-mentioned magnetic fluxes and thus all the magnetic fluxes are cancelled.

Figure 5:
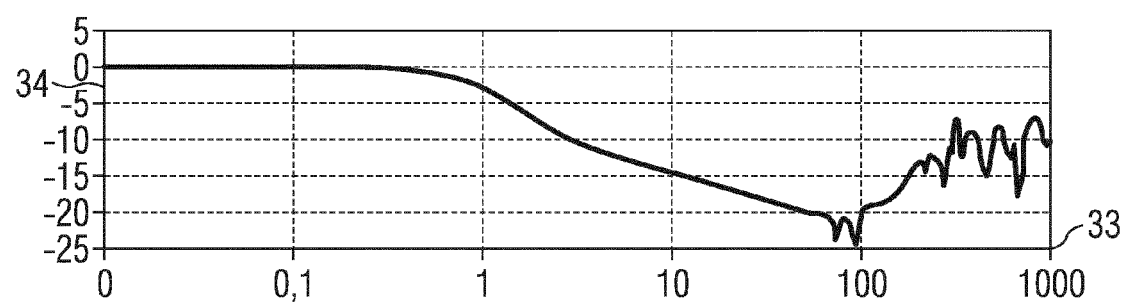
FIG. 5 shows a graph of common mode damping by means of the electrical filter illustrated in FIG. 3.

FIG. 5 shows a graph of common mode damping achieved by the electrical filter 16 illustrated in FIG. 3 with a pi filter connected downstream. A frequency in MHz is plotted on an abscissa 33 and a gain in dB on an ordinate 34. The common mode damping is approximately 20 dB in the EMC-critical VHF range around 100 MHz.

Features of the various embodiments which are only disclosed in the exemplary embodiments can be combined with one another and claimed individually.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An electrical apparatus (1) for a vehicle, the apparatus comprising:
a primary control unit (2) configured to control and supply energy to the electrical apparatus (1); and
a secondary output unit (3), downstream of the primary control unit (2), configured to output data transmitted from the control unit (2), the primary control unit (2) and the secondary output unit (3) being connected to one another via a data line (5), wherein the control unit (2) comprises an electrical filter (16) configured to suppress interference signals having three inductors (17, 18, 19) that are: (a) arranged on a ferromagnetic base body, (b) electrically isolated from one another and (c) inductively coupled to one another such that a direction of a magnetic flux generated in the base body by a first current flow in the first inductor (17) and by a second current flow in the second inductor (18) is opposite a direction of a further magnetic flux generated in the base body by a third current flow in the third inductor (19), and wherein the first inductor (17) supplies a first external supply voltage to the control unit (2), the second inductor (18) supplies a second external supply voltage to the output unit (3) via a supply voltage line (4) running between the control unit (2) and the output unit (3) and the third inductor (19) is at a common reference potential for the first supply voltage and the second supply voltage and is connected, as common return line of the first current flow and the second current flow, to a ground line running between the output unit (3) and the control unit (2).

2. The electrical apparatus (1) as claimed in claim 1, wherein the data line (5) is a shielded line, wherein the shielding (6) is a component of the ground line.

3. The electrical apparatus (1) as claimed in claim 2, wherein the output unit (3) comprises a display unit, preferably a head-up display.

4. The electrical apparatus (1) as claimed in claim 1, wherein the control unit (2) and/or the output unit has a switched-mode power supply (10, 11) for supplying one of the supply voltages.

5. The electrical apparatus (1) as claimed in claim 4, wherein the control unit (2) has a graphics control unit (8) supplied via the switched-mode power supply (10) of the control unit (2) and which transmits graphics data to the display unit (3) via the data line (5).

6. The electrical apparatus (1) as claimed in claim 1, wherein the base body is a toroidal core (20) with an open or closed magnetic path.

7. The electrical apparatus (1) as claimed in claim 1, wherein at least one of the inductors (17, 18, 19) is wound in a bifilar manner with another of the inductors (17, 18, 19).

8. The electrical apparatus (1) as claimed in claim 1, wherein the base body has three limbs connected to one another by two yokes.

9. The electrical apparatus (1) as claimed in claim 8, wherein each of the three inductors (17, 18, 19) sits on one limb.

10. The electrical apparatus (1) as claimed in claim 1, wherein the reference potential of the first supply voltage and the second supply voltage is isolated from an external reference potential.

11. The electrical apparatus (1) as claimed in claim 1, used in a motor vehicle, wherein the reference potential the electrical apparatus (1) is undefined or floating with respect to a ground potential of the motor vehicle.

* * * * *